United States Patent
Arnold et al.

(10) Patent No.: US 7,516,387 B2
(45) Date of Patent: Apr. 7, 2009

(54) SYSTEM AND METHOD FOR TRANSMITTING FEC PACKETS

(75) Inventors: James Q. Arnold, Summit, NJ (US); Robert L. Doran, Milford, NJ (US); R. Scott McCaskill, Newton, NJ (US)

(73) Assignee: Harris Corporation, Melbourne, FL (US)

( * ) Notice: Subject to any disclaimer, the term of this patent is extended or adjusted under 35 U.S.C. 154(b) by 478 days.

(21) Appl. No.: 11/355,956

(22) Filed: Feb. 17, 2006

(65) Prior Publication Data
US 2007/0220405 A1    Sep. 20, 2007

(51) Int. Cl.
  *H03M 13/00* (2006.01)
(52) U.S. Cl. .................................. 714/751; 714/758
(58) Field of Classification Search ............. 714/751, 714/758
  See application file for complete search history.

(56) References Cited

U.S. PATENT DOCUMENTS

| | | | |
|---|---|---|---|
| 6,745,364 B2 * | 6/2004 | Bhatt et al. ............... | 714/774 |
| 2003/0133446 A1 * | 7/2003 | Schoenblum ............. | 370/356 |
| 2005/0154965 A1 * | 7/2005 | Ichiki et al. .............. | 714/776 |
| 2006/0048036 A1 * | 3/2006 | Miura et al. .............. | 714/758 |
| 2008/0250299 A1 * | 10/2008 | Maillet et al. ............. | 714/776 |

OTHER PUBLICATIONS

Nafaa et al., Unequal and Interleaved FEC protocol for Robust MPEG-4 Multicasting over wireless LANs, IEEE communications society. 2004. pp. 1431-1435.*

Pro-MPEG Forum, "Transmission of Professional MPEG-2 Transport Streams over IP Networks," Pro-MPEG Code of Practice #3 release 2, Jul. 2004, 17 pages.

* cited by examiner

*Primary Examiner*—Esaw T Abraham
*Assistant Examiner*—Sam Rizk
(74) *Attorney, Agent, or Firm*—Tarolli, Sundheim, Covell & Tummino LLP

(57) ABSTRACT

A system and method for transmitting IP packets arranged in an L×D matrix comprising data packets and L number of FEC packets, L corresponding to a number of columns in the matrix, and D corresponding to a number rows in the matrix includes assigning a first location in the matrix as an FEC packet location, skipping D number of locations in the matrix from the most recently assigned FEC packet location to a new location, and determining if the new location is positioned in the same column as an existing FEC packet location. The new location is assigned as an FEC packet location if it is determined that the new location is not positioned in the same column as an existing FEC packet location. If it is determined that the new location is positioned in the same column as an existing FEC packet location, then the location is moved back in the matrix until the moved-back location is not positioned in the same column as an existing FEC packet location, and the moved-back location is assigned as an FEC packet location. The skipping, determining, assigning, and moving back are repeatedly performed until the number of FEC packet locations is equal to L. The FEC packets protecting the D previous IP packets in the same column are transmitted in accordance with the identified FEC packet locations.

11 Claims, 7 Drawing Sheets

| a1* | a2  | a3  | a4  |
|-----|-----|-----|-----|
| b1  | b2  | b3* | b4  |
| c1  | c2  | c3  | c4* |
| d1  | d2  | d3  | d4  |
| e1  | e2* | e3  | e4  |
| f1  | f2  | f3  | f4  |
| a1* | a2  | a3  | a4  |
| b1  | b2  | b3* | b4  |
| c1  | c2  | c3  | c4* |
| d1  | d2  | d3  | d4  |
| e1  | e2* | e3  | e4  |
| f1  | f2  | f3  | f4  |

FIG. 4

| a1* | a2  | a3  | a4  |
|-----|-----|-----|-----|
| b1  | b2  | b3* | b4  |
| c1  | c2  | c3  | c4* |
| d1  | d2  | d3  | d4  |
| e1  | e2* | e3  | e4  |
| f1  | f2  | f3  | f4  |
| a1* | a2  | a3  | a4  |
| b1  | b2  | b3* | b4  |
| c1  | c2  | c3  | c4* |
| d1  | d2  | d3  | d4  |
| e1  | e2* | e3  | e4  |
| f1  | f2  | f3  | f4  |

| Period (L=4) | Order (D=6) | Group #0 | #1 | #2 | #3 | Packet | |
|---|---|---|---|---|---|---|---|
| 0 | 0 | 0 | 0 | 0 | 0 | | |
| 0 | 0 | 0→1 | 0 | 0 | 0 | a1 | FEC computation of group #0 begins |
| 1 | 1 | 1 | 0 | 0 | 0 | a2 | |
| 2 | 2 | 1 | 0 | 0 | 0 | a3 | |
| 3 | 3 | 1 | 0 | 0 | 0 | a4 | |
| 0 | 4 | 2 | 0 | 0 | 0 | b1 | |
| 1 | 5 | 2 | 0 | 0 | 0 | b2 | |
| 2 | 0 | 2 | 0 | 0→1 | 0 | b3 | FEC computation of group #2 begins |
| 3 | 1 | 2 | 0 | 1 | 0 | b4 | |
| 0 | 2 | 3 | 0 | 1 | 0 | c1 | |
| 1 | 3 | 3 | 0 | 1 | 0 | c2 | |
| 2 | 4 | 3 | 0 | 2 | 0 | c3 | |
| 3 | 5 | 3 | 0 | 2 | 0→1 | c4 | FEC computation of group #3 begins |
| 0 | 1 | 4 | 0 | 2 | 1 | d1 | |
| 1 | 2 | 4 | 0 | 2 | 1 | d2 | |
| 2 | 3 | 4 | 0 | 3 | 1 | d3 | |
| 3 | 4 | 4 | 0 | 3 | 2 | d4 | |
| 0 | 5 | 5 | 0 | 3 | 2 | e1 | |
| 1 | 0 | 5 | 0→1 | 3 | 2 | e2 | FEC computation of group #1 begins |
| 2 | 1 | 5 | 1 | 4 | 2 | e3 | |
| 3 | 2 | 5 | 1 | 4 | 3 | e4 | |
| 0 | 3 | 6 | 1 | 4 | 3 | f1 | |
| 1 | 4 | 6 | 2 | 4 | 3 | f2 | |
| 2 | 5 | 6 | 2 | 5 | 3 | f3 | |
| 3 | | 6 | 2 | 5 | 4 | f4 | |
| 0 | | 6→1 | 2 | 5 | 4 | a1 | FEC for group #0 transmitted |
| 1 | | 1 | 3 | 5 | 4 | a2 | |
| 2 | | 1 | 3 | 6 | 4 | a3 | |
| 3 | | 1 | 3 | 6 | 5 | a4 | |
| 0 | | 2 | 3 | 6 | 5 | b1 | |
| 1 | | 2 | 4 | 6 | 5 | b2 | |
| 2 | | 2 | 4 | 6→1 | 5 | b3 | FEC for group #2 transmitted |
| 3 | | 2 | 4 | 1 | 6 | b4 | |
| 0 | | 3 | 4 | 1 | 6 | c1 | |
| 1 | | 3 | 5 | 1 | 6 | c2 | |
| 2 | | 3 | 5 | 2 | 6 | c3 | |
| 3 | | 3 | 5 | 2 | 6→1 | c4 | FEC for group #3 transmitted |
| 0 | | 4 | 5 | 2 | 1 | d1 | |
| 1 | | 4 | 6 | 2 | 1 | d2 | |
| 2 | | 4 | 6 | 3 | 1 | d3 | |
| 3 | | 4 | 6 | 3 | 2 | d4 | |
| 0 | | 5 | 6 | 3 | 2 | e1 | |
| 1 | | 5 | 6→1 | 3 | 2 | e2 | FEC for group #1 transmitted |
| 2 | | 5 | 1 | 4 | 2 | e3 | |
| 3 | | 5 | 1 | 4 | 3 | e4 | |
| 0 | | 6 | 1 | 4 | 3 | f1 | |
| 1 | | 6 | 2 | 4 | 3 | f2 | |
| 2 | | 6 | 2 | 5 | 3 | f3 | |
| 3 | | 6 | 2 | 5 | 4 | f4 | |

FIG. 8

SYSTEM AND METHOD FOR TRANSMITTING FEC PACKETS

FIELD OF THE INVENTION

The present invention relates generally to video transmission and, more particularly, to a system and method for transmitting compressed video over IP networks using Forward Error Correction (FEC) packets to provide robust operation.

BACKGROUND OF THE INVENTION

Recently IP-based networks have become increasingly important for delivery of professional content, including video data. Errors in data transmission are generally not acceptable, which makes some sort of FEC scheme necessary.

One issue with FEC systems on IP networks is that channel bit errors can result in packet losses. In addition, buffer and re-routing issues cause burst packet losses. The combination of packet losses from three sources—gross reordering, bit-error induced losses, and burst losses—is preferably low enough so that the FEC scheme is not broken more than the negotiated error rate. Because any bit errors cause the packet to be discarded, there is no requirement for an error correction scheme that can handle errored packets—every packet will either arrive correct or not at all.

As disclosed by the Pro-MPEG Code of Practice #3 release 2 of July, 2004, an RTP payload format for Generic Forward Error Correction Packets has been defined in the RFC 2733 to enable error correction of real time media. This standard allows the use of traditional error correcting codes and can be used with any video format standards (e.g., MPEG, SDI, SDTI, etc.) as long as it is encapsulated in an RTP packet.

To recover burst loss, the same traditional error correcting codes can be applied to non-consecutive media packets that can be spaced among many packets. Each FEC packet is associated to packets periodically selected. Therefore, consecutive RTP packets can be recovered from consecutive FEC packets as shown in FIG. 1.

In FIG. 1, the encoding scheme is schematized for L*D media packets. The period chosen is L. The payload of the kth FEC packet is computed based on the D packets numbered nL+k ($0 \leq n \leq D-1$). The main advantage of this scheme is the burst error correction capacity. The error correcting function chosen is XOR, which has the ability to recover any one lost packet.

FIG. 2 shows an example of a staggered arrangement for the case of (L=4, D=5). In this example, the FEC packet F1 protects data packets [1, 5, 9, 13, 17], while FEC packet F6 protects data packets [6, 10, 14, 18, 22]. Each FEC packet is transmitted L packet times after the last data packet it pertains to, creating a highly time-linear packet flow on the FEC stream.

The standard requires each individual column-FEC packet to indicate the base sequence number (SN-base), the offset (L) and a number of data packets (NA). Receivers can refer to these transmitted values in each FEC packet to correctly associate the FEC packet with the original data-stream packet group regardless of how the packets are staggered.

Although the Pro-MPEG Code of Practice #3 release 2 of July, 2004 suggests the use of a "staggering" FEC scheme, it does not disclose or suggest how to implement such a scheme. It would therefore be desirable to have a "staggered" FEC scheme that can accommodate varying periods (i.e., L or number of columns) and orders (i.e., D or number of rows). This scheme should stagger the FEC columns in such a way that the resultant FEC packets are as evenly spaced as possible. A scheme such as this would result in minimal end-to-end latency and memory requirements in the receiver as well as provide a more uniform distribution of packets in the transmission channel.

SUMMARY OF THE INVENTION

According to an aspect of the invention, a system and method for transmitting an IP packet arranged in an L×D matrix comprising data packets and FEC packets, L corresponding to a number of columns in the matrix, and D corresponding to a number rows in the matrix includes assigning a first location in the matrix as an FEC packet location, skipping D number of locations in the matrix from the most recently assigned FEC packet location to a new location, and determining if the new location is positioned in the same column as an existing FEC packet location. The new location is assigned as an FEC packet location if it is determined that the new location is not positioned in the same column as an existing FEC packet location. If it is determined that the new location is positioned in the same column as an existing FEC packet location, then the location is moved back in the matrix until the moved-back location is not positioned in the same column as an existing FEC packet location, and the moved-back location is assigned as an FEC packet location. The skipping, determining, assigning, and moving back are repeatedly performed until the number of FEC packet locations is equal to L. The FEC packets of the IP packet stream are transmitted in accordance with the identified FEC packet locations.

Further features, aspects and advantages of the present invention will become apparent from the detailed description of preferred embodiments that follows, when considered together with the accompanying figures of drawing.

BRIEF DESCRIPTION OF THE DRAWINGS

FIG. 4 is an example of an FEC packet distribution in accordance with the process of FIG. 3.

FIG. 5 is an example of an FEC packet distribution in accordance with the process of FIG. 3 including a representation of the data packets associated with each FEC packet.

FIG. 8 is a list of the step-by-step operations for the example shown in FIG. 5 using the process of FIG. 7.

DETAILED DESCRIPTION OF PREFERRED EMBODIMENTS

Using terminology from Pro-MPEG Code of Practice #3 release 2, FEC can be configured to work in accordance with "Period" columns (L) and "Order" rows (D). The data packets can be organized on a (Period×Order) grid with data packets transmitted in order from left-to-right, top-to-bottom.

In some conventional schemes, FEC packets are computed and transmitted as a block. These schemes transmit the grid's data as a block of (Period×Order) packets, and then they transmit Period number of FEC packets as a second block. This block-by-block transmission contributes to "bursty" data and timing difficulties with video. Interleaving the FEC packets with the data packets results in a more uniform distribution and improves the timing properties of MPEG video. However, simply spreading out the FEC packets results in increased latency and buffering required at the receiver. Thus, in addition, the blocks of data packets over which the FEC is computed are preferably staggered to match the distribution of the FEC packets.

Figure 1:
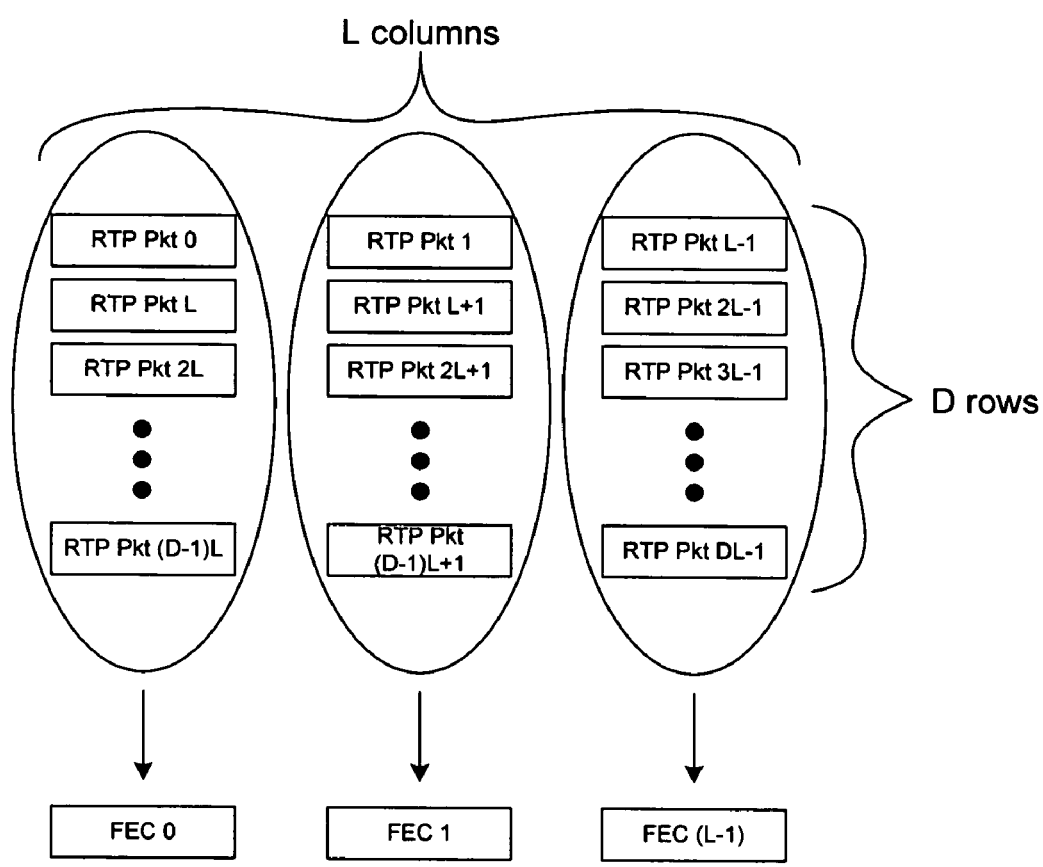
FIG. 1 is an example of a conventional FEC encoding scheme.
Figure 2:
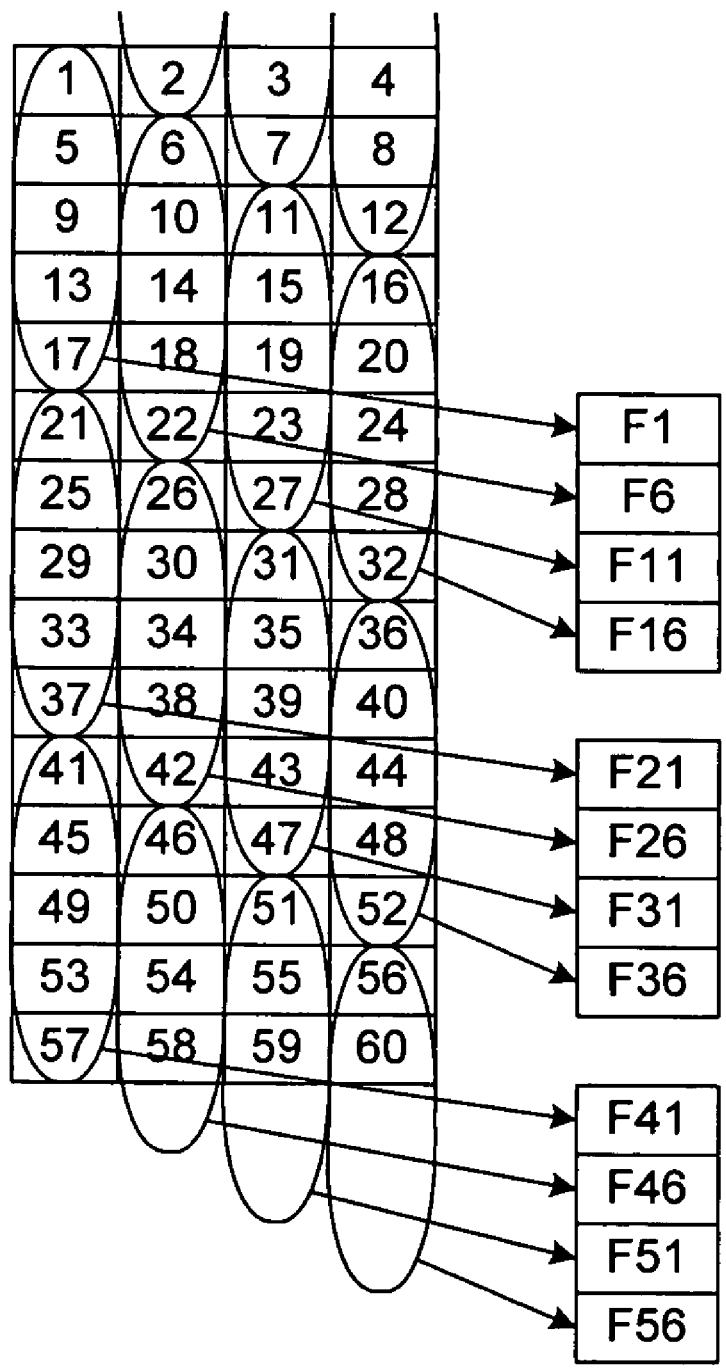
FIG. 2 is an example of a conventional FEC arrangement using staggering.
Figure 3:
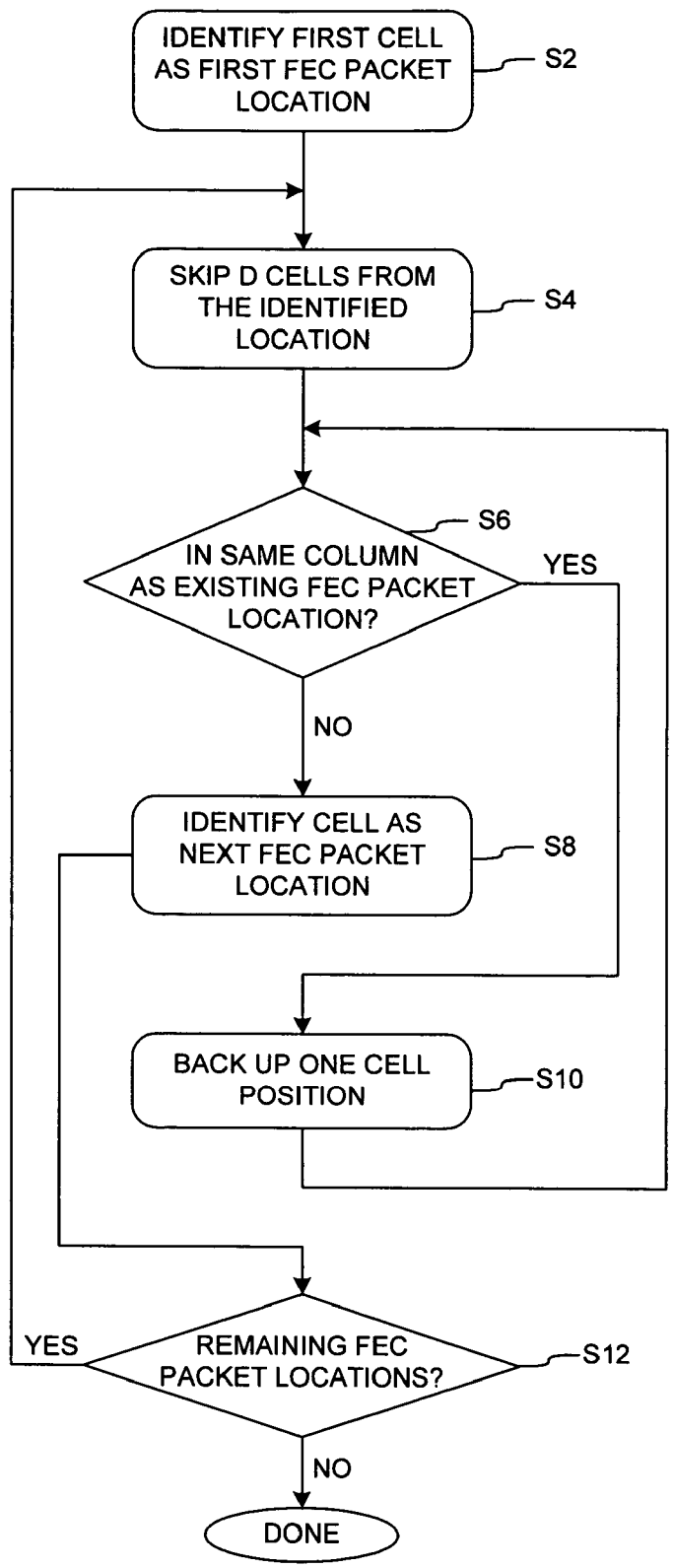
FIG. 3 is a flow chart of an FEC packet process consistent with the present invention.

FIG. 3 is a flow chart of an FEC staggering process consistent with the present invention. Using the process described by the flow chart shown in FIG. 3, FEC packets are interspersed within the data packet stream but still transmitted immediately after the block of data they protect. The data grid packets are assigned sequential indexes, from 0 to (L * D−1), and an array can be built that specifies when to send an FEC packet.

As shown in FIG. 3, the first FEC packet is placed in the first cell of the matrix (step S2). By way of illustration, FIG. 4 is a schematic representation of a matrix in which the Period L=4 and the Order D=6. An asterisk indicates where an FEC packet is to be inserted or interleaved. Accordingly, using the process of FIG. 3, an asterisk is placed in cell a1, which is the first cell of the matrix.

To identify the placement of the next FEC packet, a number of cells equal to D are skipped (step S4). The cells are skipped in the same order in which the packets are transmitted, i.e., from left to right and top to bottom. It is then checked if the cell resulting from skipping D cells is positioned in the same column as an existing FEC packet location (step S6). If not, the FEC packet is placed in the identified location (step S8).

As shown in FIG. 4 in which D=6, skipping six cells corresponds to cell b3. Since there is not an existing FEC packet in the same column as cell b3, the next FEC packet is inserted at cell b3.

A check is then performed to determine if there are any remaining FEC packet locations (step S12). The number of FEC packet locations in an L×D matrix is equal to the period L. In the example of FIG. 4, the period L is equal to four. Since at this point, only two FEC packet locations have been determined, D cells are again skipped to identify the location of the next FEC packet (step S4), and a check is repeated to determine if the identified location is positioned in the same column as an existing FEC packet (step S6). In this case, as shown in FIG. 4, skipping six cells from b3 identifies cell d1. However, since there is already an FEC packet in the same column, i.e., at cell a1, the position of the next FEC packet is changed. Specifically, the cell position is backed up one spot to c4 (step S10).

The check is repeated to determine if the identified location is positioned in the same column as an existing FEC packet (step S6). As shown in FIG. 4, backing up one cell from d1 identifies cell c4. Since there is not an existing FEC packet in the same column as cell c4, the next FEC packet is inserted at cell c4 (step S8).

Since only three of the four FEC packet locations have been determined (step S12), D cells are again skipped to identify the location of the next FEC packet (step S4), and a check is repeated to determine if the identified location is positioned in the same column as an existing FEC packet (step S6). In this case, as shown in FIG. 4, skipping six cells from c4 identifies cell e2. Since there is not an FEC packet in the same column as cell e2, the next FEC packet is inserted at cell e2 (step S8).

At this point, the process has identified an FEC packet insertion location for each column of the matrix. Accordingly, no further locations need to be identified, and the same packet insertion locations can be used for each L×D matrix.

Based on the determined FEC packet insertion locations, it is possible to determine which data packets are used to generate each FEC packet. In general, each FEC packet includes correction data for a number of data packets D preceding the FEC packet insertion location in the same column. This is shown schematically in FIG. 5. As shown in FIG. 5, the FEC packet at cell a1 (i.e., Fb1) includes the correction data for the data packets at b1, c1, d1, e1, f1, and a1. Thus, the FEC packet at cell a1 in FIG. 5 includes correction data for six data packets, which is the same number as the order D. The same situation applies for the FEC packets at cells Fc3, Fd4 and Ff2. During actual transmission, as shown in FIG. 5, the FEC packet can be transmitted by interleaving the FEC packet with the next data packet in that FEC packet's associated column. For example, the FEC packet at cell a1, Fb1, is transmitted at the "same time" as data packet b1.

It will be appreciated by those skilled in the art that this process may be implemented in a variety of systems. One example will now be described in reference to FIG. 6.

Figure 6:
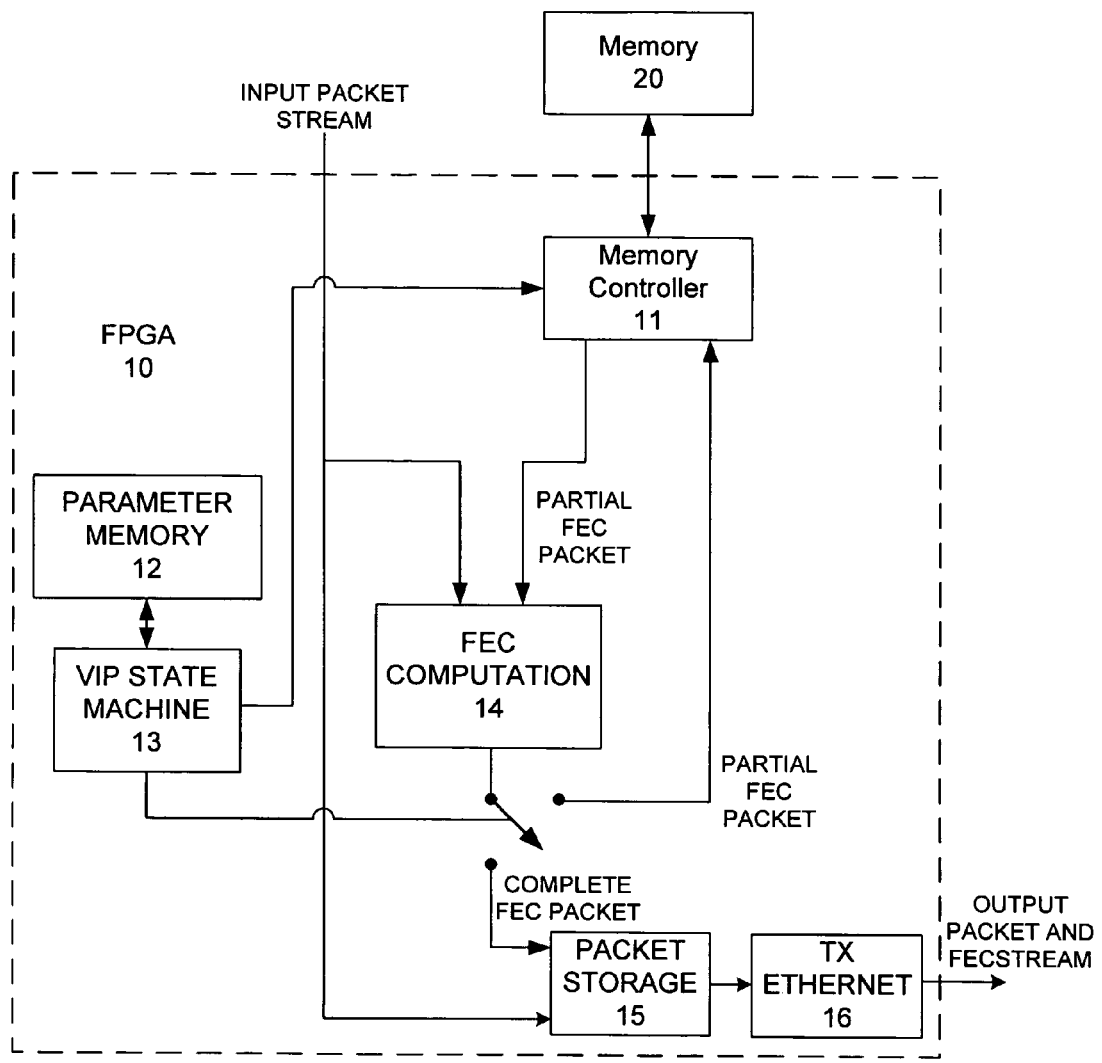
FIG. 6 is a block diagram of an implementation of an FEC packet distribution system using the FEC packet process of FIG. 3 including a state machine for control.

As illustrated generally in FIG. 6, a Gigabit Ethernet interface 16 is utilized, which can support multiple channels of Video over IP (VIP) with Forward Error Correction (FEC). While various implementations are possible according to techniques known in the art, in this example a Field Programmable Gate Array (FPGA) 10 and a memory 20 are utilized. The memory can be implemented, for example, as a Synchronous Dynamic Random Access Memory (SDRAM), a non-volatile RAM (NVRAM), or some other type of rewritable storage. Within the FPGA 10 and supporting firmware, a common "FEC engine" can be configured to process the many interleaved streams in accordance with the technique illustrated in FIG. 3. This exemplary implementation allows the use of one "FEC engine" by many independent VIP channels. As described below, a parameter memory 12 in the FPGA stores the VIP channel parameters and state information. This allows each channel to have a unique set of configuration parameters for the L and D values.

With reference to FIG. 6, when an IP packet for a particular channel is about to be transferred to the FPGA 10, a VIP state machine 13 reads the parameters for the sending channel from the parameter memory 12. The VIP state machine 13 determines the FEC group to which the packet belongs, and instructs the memory controller 11 to fetch a partial FEC packet for that group from the memory 20. The IP packet received by the FPGA 10 is both buffered in a packet storage buffer 15 and processed by an FEC computation 14 with the partial FEC packet fetched from the memory 20. The FEC computation 14 processes the received IP packet and the partial FEC packet to generate a new partial FEC packet. The processing of the FEC computation 14 can be, for example, the result of an XOR operation between the received IP packet and the partial FEC packet. The result of the FEC computation 14 is written back into the memory 20 by the memory controller 11 as the next partial FEC packet.

This process continues until the VIP state machine 13 determines that the received packet is the last one in an FEC group. Once this is determined, instead of writing back the result of the FEC computation 14 into the memory 20, the result is sent to the packet storage buffer 15 as a completed FEC packet, and a clear partial FEC packet is written back to the memory 20. This operation serves to set up the start of the next group. The packet storage buffer 15 passes the packets to the Ethernet interface 16, which sends them out the Ethernet transmission channel.

In one embodiment, the VIP state machine 13 can be configured to maintain the following counters: "Period": A counter that counts from 0 to (Lvalue−1); "Order": A counter that counts from 0 to (Dvalue−1); and a series of "Group[N]" counters, one for each FEC group: Counts from 1 to Dvalue to indicate number of partial FEC packet computations completed so far for that group or contains a 0 indicating the group is still in the initialization stage. On initialization of a channel, Order, Period and all Group counter values are set to 0.

Figure 7:
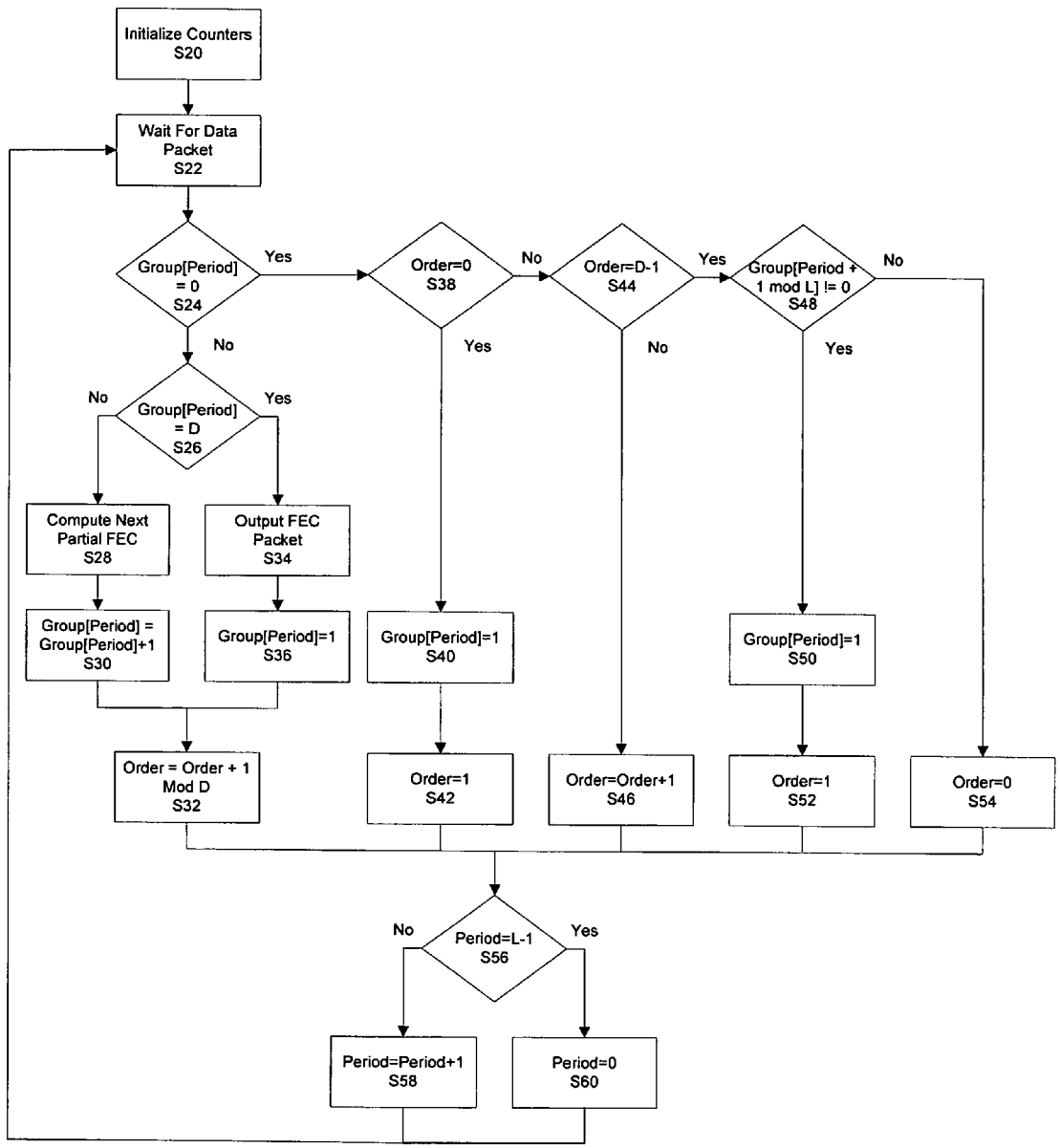
FIG. 7 is a flow chart for the operation of the state machine shown in FIG. 6.

A flow chart of the VIP state machine 13 is shown in FIG. 7, and the step-by-step operations for the example shown in FIG. 5 are shown in FIG. 8. After initializing the counters (step S20), the VIP state machine waits for a new data packet to be ready for transmission (step S22). It then checks if the Group register indicated by the Period counter is zero (step S24). If not, it checks to see if it is equal to D, which is the length of the FEC group (step S26). If so, the completed FEC packet is sent to the packet buffer (step S34), and the Group counter is set to 1 (step S36). Otherwise, the partial FEC packet is written back to the memory 20 (step S28), and the Group counter is incremented (step S30). After either case, the Order counter is incremented by 1 between 0 and D−1 (step S32).

If the Group counter was 0 (step S24), it indicates the group is still in the initialization state, and the following tests are done to determine if FEC packet generation should be started with this packet. First, the Order counter is checked to see if it is zero (step S38). If so, the Group counter is set to 1 (step S40), and the Order counter is set to 1 (step S42). Second, the Order counter is checked to see if it currently has a value of D−1, and thus it will increment to 0 on the next packet (step S44). If not, the Order counter is incremented, and the Group counter is left as-is. Third, a check is done to see if the next Group counter has been initialized (step S48). If so, the current one is also initialized by setting the Group counter to 1 (step S50), and the Order counter is set to a value of 1 (step S52). Finally, if all these tests fail, the group is left in the initialized state, and the Order counter is set to 0 (step S54).

As a final step for all these operations, the Period counter is incremented by 1 in the range from 0 to L−1. To do so, a check is done to see if the Period counter is equal to L−1 (step S56). If so, the Period counter is set to 0 (step S60). If not, the Period counter is incremented by 1 (step S58). At that point the state machine waits for the next data packet to arrive (step S22).

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments (which can be practiced separately or in combination) were chosen and described in order to explain the principles of the invention and as practical application to enable one skilled in the art to make and use the invention in various embodiments and with various modifications suited to the particular use contemplated. It is intended that the scope of the invention be defined by the claims appended hereto and their equivalents.

What is claimed is:

1. A method for transmitting a group of IP packets arranged in an L by D matrix comprising L×D data packets and L number of FEC packets protecting columns of the matrix, L corresponding to a number of columns in the matrix, and D corresponding to a number rows in the matrix, the method comprising:
   a) assigning a first location in the matrix as an FEC packet location;
   b) skipping D number of locations in the matrix from the most recently assigned FEC packet location to a new location;
   c) determining if the new location is positioned in the same column as an existing FEC packet location;
   d) assigning the new location as an FEC packet location if it is determined that the new location is not positioned in the same column as an existing FEC packet location;
   e) if it is determined that the new location is positioned in the same column as an existing FEC packet location, moving back in the matrix until the moved-back location is not positioned in the same column as an existing FEC packet location and assigning the moved-back location as an FEC packet location;
   f) repeating steps b)-e) until the number of FEC packet locations is equal to L; and
   g) transmitting the FEC packets in accordance with the identified FEC packet locations such that each FEC packet protects D prior data packets in the same column of the L by D matrix as the respective FEC packet.

2. A method according to claim 1, further comprising:
receiving a data packet;
generating a partial FEC packet from the received data packet and a previously generated partial FEC packet;
determining if the partial FEC packet has been generated from D number of data packets;
transmitting the partial FEC packet as a complete FEC packet if the partial FEC packet has been generated from D number of data packets; and
storing the partial FEC packet in a memory if the partial FEC packet has been generated from less than D number of data packets.

3. A method according to claim 2, further comprising:
maintaining a period counter that counts from 0 to L−1;
maintaining an order counter that counts from 0 to D×1; and
maintaining L number of group counters, one for each FEC group, that counts from 1 to D to indicate a number of partial FEC packet computations completed.

4. A method according to claim 3, wherein the step of determining if the partial FEC packet has been generated from D number of data packets includes checking if the value of the group counter for the FEC group associated with the generated partial FEC packet is equal to D,
   wherein the step of transmitting the partial FEC packet includes transmitting the partial FEC packet as the complete FEC packet if the value of the group counter for the FEC group associated with the generated partial FEC packet is equal to D, and
   wherein the group counter for the FEC group associated with the generated partial FEC packet is incremented by one if the value of the group counter for the FEC group associated with the generated partial FEC packet is not equal to D.

5. A method according to claim 1, wherein the group of IP packets are transmitted in accordance with Pro-MPEG Code of Practice #3, release 2.

6. A system for transmitting a group of IP packets arranged in an L by D matrix comprising L×D data packets and L number of FEC packets protecting columns of the matrix, L corresponding to a number of columns in the matrix, and D corresponding to a number rows in the matrix, the system comprising:
   a processor;
   a memory, coupled to the processor, the memory comprising a plurality of instructions executed by the processor, the plurality of instructions configured to:

a) assign a first location in the matrix as an FEC packet location;
b) skip D number of locations in the matrix from the most recently assigned FEC packet location to a new location;
c) determine if the new location is positioned in the same column as an existing FEC packet location;
d) assign the new location as an FEC packet location if it is determined that the new location is not positioned in the same column as an existing FEC packet location;
e) if it is determined that the new location is positioned in the same column as an existing FEC packet location, move back in the matrix until the moved-back location is not positioned in the same column as an existing FEC packet location and assigning the moved-back location as an FEC packet location; and
f) repeat b)-e) until the number of FEC packet locations is equal to L; and an interface configured to transmit the FEC packets of the IP packet in accordance with the identified FEC packet locations such that each FEC packet protects D prior data packets in the same column of the L by D matrix as the respective FEC packet.

7. A system according to claim 6, further comprising:
a packet storage buffer that receives and stores a data packet;
an FEC computation unit that generates a partial FEC packet from the received data packet and a previously generated partial FEC packet;
a partial FEC packet memory that stores the partial FEC packet generated by the FEC computation unit if the partial FEC packet has been generated from less than D number of data packets;
wherein the interface transmits the partial FEC packet as a complete FEC packet if the partial FEC packet has been generated from D number of data packets.

8. A system according to claim 7, further comprising:
a state machine configured to maintain a period counter that counts from 0 to L−1, an order counter that counts from 0 to D−1, and L number of group counters, one for each FEC group, that counts from 1 to D to indicate number of partial FEC packet computations completed, wherein the state machine increments and sets the value of the counters in accordance with received data packets and the FEC packet locations.

9. A system according to claim 8, wherein the state machine is configured to check if the value of the group counter for the FEC group associated with the generated partial FEC packet is equal to D,
wherein the interface transmits the partial FEC packet as the complete FEC packet if the state machine determines that the value of the group counter for the FEC group associated with the generated partial FEC packet is equal to D, and
wherein state machine increments by one the group counter for the FEC group associated with the generated partial FEC packet if the value of the group counter for the FEC group associated with the generated partial FEC packet is not equal to D.

10. A system according to claim 6, wherein the group of IP packets are transmitted in accordance with Pro-MPEG Code of Practice #3, release 2.

11. A system for transmitting a group of IP packets arranged in an L by 0 matrix comprising L×D data packets and L number of FEC packets protecting columns of the matrix, L corresponding to a number of columns in the matrix, and D corresponding to a number rows in the matrix, the system comprising:
means for assigning one FEC packet location in each column of the L by D matrix such that the FEC packet locations are evenly distributed in the L by D matrix in a staggered manner; and
an interface configured to transmit the FEC packets protecting the IP packet group in accordance with the identified FEC packet locations such that each FEC packet protects D prior data packets in the same column of the L by D matrix as the respective FEC packet.

* * * * *